United States Patent
Sasagawa et al.

(10) Patent No.: US 8,597,992 B2
(45) Date of Patent: Dec. 3, 2013

(54) TRANSISTOR AND MANUFACTURING METHOD OF THE SAME

(75) Inventors: Shinya Sasagawa, Chigasaki (JP); Masashi Tsubuku, Atsugi (JP); Hitoshi Nakayama, Atsugi (JP); Daigo Shimada, Atsugi (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 177 days.

(21) Appl. No.: 13/026,520

(22) Filed: Feb. 14, 2011

(65) Prior Publication Data

US 2011/0207269 A1    Aug. 25, 2011

(30) Foreign Application Priority Data

Feb. 19, 2010  (JP) .................. 2010-035434

(51) Int. Cl.
*H01L 21/00* (2006.01)

(52) U.S. Cl.
USPC ............. 438/158; 438/40; 438/43; 438/159; 438/182; 438/454; 438/498; 438/504; 438/673; 438/706; 438/713; 257/387; 257/E21.011; 257/E21.19; 257/E21.476; 257/E29.116

(58) Field of Classification Search
None
See application file for complete search history.

(56) References Cited

U.S. PATENT DOCUMENTS

| | | | |
|---|---|---|---|
| 5,028,551 A | 7/1991 | Dohjo et al. | |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |

(Continued)

FOREIGN PATENT DOCUMENTS

| EP | 1737044 A | 12/2006 |
|---|---|---|
| EP | 2226847 A | 9/2010 |

(Continued)

OTHER PUBLICATIONS

Fortunato.E et al., "Wide-Bandgap High-Mobility ZNO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Yasser Abdelaziez
(74) *Attorney, Agent, or Firm* — Eric J. Robinson; Robinson Intellectual Property Law Office, P.C.

(57) ABSTRACT

A transistor is manufactured by a method including: forming a first wiring layer; forming a first insulating film to cover the first wiring layer; forming a semiconductor layer over the first insulating film; forming a conductive film over the semiconductor layer; and performing at least two steps of etching on the conductive film to form second wiring layers which are apart from each other, wherein the two steps of etching include at least a first etching process performed under the condition that the etching rate for the conductive film is higher than the etching rate for the semiconductor layer, and a second etching process performed under the condition that the etching rates for the conductive film and the semiconductor layer are higher than those of the first etching process.

24 Claims, 12 Drawing Sheets

(56) References Cited

U.S. PATENT DOCUMENTS

| | | | |
|---|---|---|---|
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0272989 A1* | 11/2007 | Suzawa et al. ............... 257/408 |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0061573 A1 | 3/2009 | Miyairi et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0062556 A1 | 3/2010 | Sasagawa et al. |
| 2010/0065844 A1 | 3/2010 | Tokunaga |
| 2010/0092800 A1 | 4/2010 | Itagaki et al. |
| 2010/0105163 A1* | 4/2010 | Ito et al. ...................... 438/104 |
| 2010/0109002 A1 | 5/2010 | Itagaki et al. |
| 2010/0117077 A1 | 5/2010 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| WO | WO-2004/114391 | 12/2004 |

OTHER PUBLICATIONS

Dembo.H et al., "RFCPUS on Glass and Plastic Substrates Fabricated by TFT Transfer technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, Vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous OxideSemiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$-$Ga_2ZnO_4$-ZnO system at 1350° C,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m = 3, 4, and 5), $InGaO_3(ZnO)3$,

(56) References Cited

OTHER PUBLICATIONS and Ga2O3(ZnO)m (m = 7, 8, 9, and 16) in the In2O3-ZnGa2O4-ZnO system,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using singel-crystalline InGaO3(ZO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA Amoled Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008; vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5') Flexible Full Color Top Emission AMOLED Display on Plastic Film and its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTS,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZNO TFT,", IMID '07 Digest, 2007, pp. 1249-1252.

Godo.H et al., "Temperature Dependence of Characteristics and Electronic Structure for Amorphous In-Ga-Zn-Oxide TFT,",AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In-Ga-Zn-Oxide TFTS With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology, ", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YBFE2O4, and YB2FE3O7 Types of Structures for Compounds in the In2O3 and SC2O3-A2O3-BO Sys-

(56) References Cited

OTHER PUBLICATIONS tems [A; Fe, Ga, Or Al; B: Mg, Mn, Fe, Ni, Cu, Or Zn]at Temperatures over 1000° C,", Journal of Solid State Chemistry, 1985, vol. 60, pp. 382-384.
Kitzerow.H et al., "Observation of Blue Phases in Chiral Networks,", Liquid Crystals, 1993, vol. 14, No. 3, pp. 911-916.
Costello.M et al., "Electron Microscopy of a Cholesteric Liquid Crystal and Its Blue.Phase,", Phys. Rev. A (Physical Review. A), May 1, 1984, vol. 29, No. 5, pp. 2957-2959.
Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.
Orita.M et al., "Mechanism of Electrical Conductivity of Transparent InGaZnO4,", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors,", JPN. J. Appl. Phys. (Japanese Journal of Applied Physics), 2006, vol. 45, No. 5B, pp. 4303-4308.
Janotti.A et al., "Native Point Defects in ZnO,", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water,", Appl. Phys. Lett. (Applied Physics Letters) 2008, vol. 92, pp. 072104-1-072104-3.
Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.
Janotti.A et al., "Oxygen Vacancies in ZnO,", Appl. Phys. Lett. (Applied Physics Letters), 2005, vol. 87, pp. 122102-1-122102-3.
Oba.F et al., "Defect energetics in ZnO: A hybrid Hartree-Fock density functional study,", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor,", Philosophical Magazine, 2001, vol. 81, No. 5, pp. 501-515.
Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays,", IDW '08 : Proceedings of the 6th International Display Workshops, Dec. 3, 2008, pp. 581-584.
Kim.S et al., "High-Performance oxide thin film transistors passivated by various gas plasmas,", 214th ECS Meeting, 2008, No. 2317, ECS.
Clark.S et al., "First Principles Methods Using CASTEP,", Zeitschrift fur Kristallographie, 2005, vol. 220, pp. 567-570.
Lany.S et al., "Dopability, Intrinsic Conductivity, and Nonstoichiometry of Transparent Conducting Oxides,", Phys. Rev. Lett. (Physical Review Letters), Jan. 26,2007, vol. 98, pp. 045501-1-045501-4.
Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.
Oh.M et al., "Improving the Gate Stability of ZNO Thin-Film Transistors With Aluminum Oxide Dielectric Layers,", J. Electrochem. Soc.(Journal of the Electrochemical Society, 2008, vol. 155, No. 12, pp. H1009-H1014.
Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

* cited by examiner

TRANSISTOR AND MANUFACTURING METHOD OF THE SAME

BACKGROUND OF THE INVENTION

1. Field of the Invention

The present invention relates to a transistor and a manufacturing method of the same.

2. Description of the Related Art

In recent years, metal oxides having the characteristics of semiconductors (hereinafter, oxide semiconductors) have attracted attention. Metal oxides having the characteristics of semiconductors may be applied to a transistor (see Patent Documents 1 and 2).

There are many types of transistors. For example, transistors may be classified as a bottom gate-type structure and a top gate-type structure according to the positional relationship among a substrate, a gate, and a channel formation area. A transistor structure having a gate placed between a channel formation area and a substrate is called a bottom gate-type structure. A transistor structure having a channel formation area placed between a gate and a substrate is called a top gate-type structure.

In addition, transistors may be classified as a bottom contact type and a top contact type according to the connection position of a source and a drain with a semiconductor layer in which a channel is formed. A structure where the connection position of a source and a drain with a semiconductor layer in which a channel is formed is placed on a substrate side is called a bottom contact structure. A structure where the connection position of a source and a drain with a semiconductor layer in which a channel is formed is placed on a side opposite to a substrate is called a top contact structure.

Types of transistors are classified as a BGBC (bottom gate bottom contact) structure, a BGTC (bottom gate top contact) structure, a TGTC (top gate top contact) structure, and a TGBC (top gate bottom contact) structure.

REFERENCES

[Patent Document 1] Japanese Published Patent Application No. 2007-123861

[Patent Document 2] Japanese Published Patent Application No. 2007-96055

In one embodiment of the present invention a transistor has a sufficiently large on-state current and a sufficiently small off-state current. Such transistor having a sufficiently large on-state current and a sufficiently small off-state current has improved switching characteristics.

Meanwhile, in other embodiments a transistor when applied to many types of products has high reliability.

One method for testing reliability of a transistor is via a bias-thermal stress test (hereinafter, BT test). A BT test is a type of accelerated test and can evaluate changes in the characteristics of a transistor, which occur due to long term usage, in a short time. In particular, the change between transistor threshold voltages before and after a BT test is an important factor for testing reliability. The smaller the change between transistor threshold voltages before and after a BT test, the higher the reliability.

In particular, the temperature of a substrate over which a transistor is formed is fixed. A source and a drain of the transistor are at the same potential, and a potential different from the potential of the source and the drain is applied to a gate for a predetermined time period. The temperature of the substrate may be determined depending on the purpose of the test. Further, the potential applied to the gate is higher than the potential of the source and the drain in a "+BT test" while the potential applied to the gate is lower than the potential of the source and the drain in a "−BT test."

Strength of the BT test may be determined based on the temperature of a substrate and the electric field intensity and time period of application of the electric field to a gate insulating layer. The electric field intensity in a gate insulating layer is determined as the value of a potential difference between a gate, and a source and a drain divided by the value of the thickness of the gate insulating layer. For example, when an electric field intensity of the gate insulating layer having thickness of 100 nm is 2 MV/cm, the potential difference is 20 V.

Furthermore, a change in the threshold voltage by a BT test is also detected in a transistor having an oxide semiconductor in a channel formation area.

Therefore, in one embodiment of the present invention a transistor has high reliability and a threshold voltage which is difficult to shift despite long term usage.

Thus, the present invention would in some embodiments provide a transistor having high reliability and improved switching characteristics.

SUMMARY OF THE INVENTION

A transistor with high reliability according to one embodiment can be achieved by improving coverage of each layer formed therein. In order to improve the coverage of each layer formed in the transistor, in particular, a wiring layer is configured so that its taper angles are small.

Detailed features of one embodiment of the present invention will be explained below.

One embodiment of the present invention is a method having at least a first etching and a second etching. In the first etching, the etching rate for the "film to be etched" is higher than the etching rate for the "layer formed beneath the film to be etched". Further, the first etching adopts an etching method that can be performed while making a mask recede. The second etching in some embodiments adopts an etching process in which the etching rates for the "film to be etched" and the "layer formed beneath the film to be etched" are higher than those of the first etching.

According to some embodiments, it is preferable that the second etching takes less time than the first etching does.

An etching method according to other embodiments can be applied to the processes of manufacturing a transistor. In particular, when the "film to be etched" is a conductive film, methods in accordance with the present invention may be used.

In a BGTC structure, when the "film to be etched" is a conductive film that becomes a source electrode and a drain electrode and the "layer formed beneath the film to be etched" is a semiconductor layer, methods in accordance with the present invention may be used.

In a BGBC structure, when the "film to be etched" is a conductive film that becomes a source electrode and a drain electrode and the "layer formed beneath the film to be etched" is a gate insulating layer, methods in accordance with the present invention may be used.

However, while not limited to the above, an etching method according to another embodiment may be applied when etching a conductive film to become a gate electrode in a BGTC or BGBC structure. Here, the "layer formed beneath the film to be etched" is a substrate.

In a TGTC structure, when the "film to be etched" is a conductive film that becomes a source electrode and a drain electrode and the "layer formed beneath the film to be etched"

is a semiconductor layer, methods in accordance with the present invention may be used.

In a TGBC structure, when the "film to be etched" is a conductive film that becomes a source electrode and a drain electrode and the "layer formed beneath the film to be etched" is a base layer, methods in accordance with the present invention may be used.

However, while not limited to the above, an etching method according to an embodiment of the present invention may be applied when etching a conductive film to become a gate electrode in the TGTC or TGBC structure. Here, the "layer formed beneath the film to be etched" is a gate insulating layer.

An example of an etching method according to another embodiment of the present invention is illustrated below. For instance, when the "film to be etched" is a film comprising Ti, W, Mo or Ta, or nitride thereof and the "layer formed beneath the film to be etched" is an oxide semiconductor layer, in some embodiments the first etching is performed using $SF_6$ and the second etching is performed using a mixed gas of $BCl_3$ and $Cl_2$.

Further, the taper angle may in some embodiments refer to an internal angle formed between a substrate surface and the side surface of a layer. The taper angle is over 0 degrees and below 180 degrees.

According to one embodiment of the present invention, a transistor can be obtained by making a taper angle of a wiring layer small and adjusting the thickness of a semiconductor layer.

Further, in some embodiments, a transistor having improved coverage of a layer covering a wiring layer can be obtained because the taper angle of the wiring layer is small.

Moreover, in other embodiments, by adjusting the thickness of a semiconductor layer, the on-state current of the semiconductor layer can become sufficiently large and the off-state current of the semiconductor layer can become sufficiently small. Further, the unevenness of thickness of a semiconductor layer within substrate surface, which occurs due to etching, can be avoided and the unevenness of characteristics can also be avoided.

According to one embodiment of the present invention, a transistor having characteristics which are hardly shifted in a BT test can be obtained.

DETAILED DESCRIPTION OF THE INVENTION

Figure 1A:
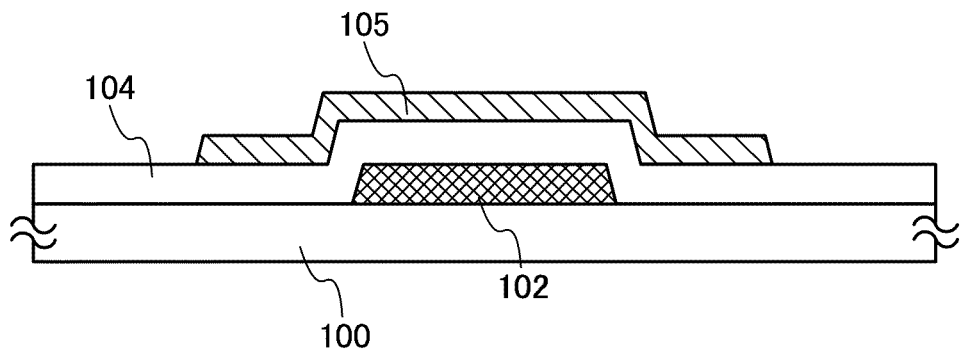
FIGS. 1A to 1D are views showing a manufacturing method of a transistor according to one embodiment of the present invention.

Hereinafter, embodiments of the present invention will be described in detail with reference to the accompanying drawings. However, it should be understood to those skilled in the art that the present invention is not limited to the following description but various modifications and changes may be made without departing from the spirit and scope of the invention. Therefore, the present invention should not be construed to be limited to the disclosed embodiments and examples. Further, when the present invention is described with reference to the accompanying drawings, a reference number indicating the same object is commonly used among different drawings. Moreover, when the same object is indicated, the hatch pattern is the same, and any reference number may not be assigned.

Furthermore, hereinafter, ordinal numbers, such as "first" and "second," are used merely for convenience, and the present invention is not limited to the numbers.

Embodiment 1

This embodiment is a transistor and a manufacturing method of the same according to one embodiment of the present invention.

A manufacturing method of a transistor of this embodiment described with reference to FIGS. 1A to 1D and FIGS. 2A to 2D is characterized by including: forming a first wiring layer 102, forming a first insulating layer 104 to cover the first wiring layer 102, forming a semiconductor layer 105 over the first insulating layer 104, forming a conductive film 107 over the semiconductor layer 105, and performing at least two steps of etching at the conductive film 107 to form second wiring layers 108 to be apart from each other, wherein the at least two steps of etching include at least a first etching step, which is performed under the condition that the etching rate for the conductive film 107 is higher than the etching rate for the semiconductor layer 105, and a second etching step, which is performed under the condition that the etching rates for the conductive film 107 and the semiconductor layer 105 are higher than those of the first etching step.

FIGS. 1A to 1D and FIGS. 2A to 2D are views showing a manufacturing method of a transistor according to this embodiment.

First, a first wiring layer 102 is selectively formed over a substrate 100, a first insulating layer 104 is formed to cover the first wiring layer 102, and a semiconductor layer 105 is selectively formed over the first insulating layer 104 (FIG. 1A).

The substrate 100 has an insulative surface. For example, a glass substrate, a quartz substrate, a semiconductor substrate having an insulating layer formed on its surface, or a stainless steel substrate having an insulating layer formed on its surface may be used.

The first wiring layer 102 constitutes at least a gate electrode of a transistor. The first wiring layer 102 may be formed using a conductive material.

At least a gate insulating layer of a transistor includes the first insulating layer 104. The first insulating layer 104 may be made of silicon oxide, silicon nitride, or silicon oxynitride, etc., and in some embodiments the first insulating layer 104 is formed by sputtering so that moisture and hydrogen are removed as much as possible from the first insulating layer 104 which is in contact with the semiconductor layer 105.

Further, the presence of "silicon oxynitride" means that the oxygen content is more than nitrogen content, and in some embodiments, the oxygen content is 50 at. % to 70 at. %, the nitrogen content is 0.5 at. % to 15 at. %, the silicon content is 25 at. % to 35 at. %, and the hydrogen content is 0.1 at. % to 10 at. % when the contents are measured by using Rutherford Backscattering Spectrometry (RBS) and Hydrogen Forward Scattering (HFS).

Moreover, the presence of "silicon nitride oxide" means that nitrogen content is more than oxygen content in it, and in some embodiments, the oxygen content is 5 at. % to 30 at. %, the nitrogen content is 20 at. % to 55 at. %, the silicon content is 25 at. % to 35 at. %, and the hydrogen content is 10 at. % to 30 at. % when the contents are measured by using RBS and HFS. Meanwhile, the above ranges of contents of nitrogen, oxygen, silicon, and hydrogen are under the assumption that total sum of all atoms in silicon oxynitride or silicon nitride oxide is 100 at. %.

Here, the semiconductor layer 105 is formed of oxide semiconductor.

For forming the semiconductor layer 105, an oxide semiconductor, which becomes an intrinsic (I-type) or substantially becomes an intrinsic (I-type) by removing impurities to highly purify the oxide semiconductor so that impurities which are carrier donors besides main components do not exist in the oxide semiconductor as much as possible, is used.

The amount of carriers in a highly purified oxide semiconductor layer may be extremely small (close to zero) in some embodiments (i.e., carrier concentration is below $1\times10^{14}/cm^3$, and in some embodiments below $1\times10^{12}/cm^3$, and in other embodiments below $1\times10^{11}/cm^3$).

The off-state current can become small in a transistor because the amount of carriers in an oxide semiconductor layer forming the semiconductor layer 105 is extremely small. In some embodiments that off-state current is as small as possible.

The interface between the first insulating layer 104 and the semiconductor layer 105 is important because such a highly purified oxide semiconductor is very sensitive to the interface state and interface charge. Thus, in some embodiments the first insulating layer 104 which is in contact with the highly purified oxide semiconductor has high quality.

In other embodiments the first insulating layer 104 is formed, for example, by high density plasma CVD using microwave (e.g. frequency of 2.45 GHz) because it is able to have fineness and high dielectric strength. It is because the interface state is reduced and the interface quality is improved by forming the highly purified oxide semiconductor and the high quality gate insulating layer to be in close contact with each other.

Of course, other methods for forming a layer, such as sputtering, plasma CVD, or the like, by which a high quality insulating layer as the first insulating layer 104 can be formed, may be also adopted.

As an oxide semiconductor for forming the semiconductor layer 105, a four element-based metal oxide such as In—Sn—Ga—Zn—O-based oxide semiconductor, a three element-based metal oxide such as In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor and a Sn—Al—Zn—O-based oxide semiconductor, a two element-based metal oxide such as In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, and an In—Mg—O-based oxide semiconductor, or an In—O-based oxide semiconductor, a Sn—O-based oxide semiconductor, a Zn—O-based oxide semiconductor and the like, may be used. Further, the oxide semiconductor may include $SiO_2$. For example, an In—Ga—Zn—O-based oxide semiconductor may be an oxide film having In, Ga, or Zn regardless of its stoichiometry ratio. Further, it may include other elements in addition to In, Ga and Zn.

An oxide semiconductor forming the semiconductor layer 105 may be represented as the chemical formula, $InMO_3(ZnO)_m$ (m>0). Here, M is one or more metal elements selected from Ga, Al, Mn, and Co. For example, M may be Ga, Ga and Al, Ga and Mn, Ga and Co, or the like. Further, the oxide semiconductor may include $SiO_2$.

Moreover, an In—Ga—Zn—O film may be formed by using an oxide target, for example, $In_2O_3:Ga_2O_3:ZnO=1:1:1$ (mole ratio) as a target for manufacturing the thin film of the oxide semiconductor to form the semiconductor layer 105 by sputtering. Further, the above examples are not limited to the material and proportions of the above target, for example, the oxide target of $In_2O_3:Ga_2O_3:ZnO=1:1:2$ (mole ratio) may be used. For example, an In—Ga—Zn—O film may be an oxide film having indium (In), gallium (Ga), zinc (Zn) regardless of its stoichiometry ratio.

The oxide semiconductor forming the semiconductor layer 105 may be formed by sputtering using an In—Ga—Zn—O-based oxide target. Further, the semiconductor layer 105 may be formed by sputtering under a rare gas (for example, argon) atmosphere, an oxygen atmosphere, or an atmosphere including a rare gas and an oxygen gas.

For example, an In—Ga—Zn—O film may be an oxide film having In, Ga, or Zn regardless of its stoichiometry ratio.

Furthermore, the filling rate of the oxide target is 90% to 100%, and in some embodiments 95% to 99.9%. Using a metal oxide target with high filling rate enables the formed oxide semiconductor film to be a dense film.

Next, a first heating process is performed on the semiconductor layer 105. The first heating process enables the oxide semiconductor layer to be dehydrated or dehydrogenated. The temperature of the first heating process is 400° C. to 750° C., or equal to or above 400° C. and below the strain point of a substrate. In one embodiment, the oxide semiconductor layer may be formed by performing a heating process on the oxide semiconductor layer at a temperature of 450° C. for 1 hour under a nitrogen atmosphere. Further, the first heating process may be performed after forming the oxide semiconductor layer. However the timing is not limited to the foregoing examples. Further, the atmosphere for performing the first heating process may be not only a nitrogen atmosphere, but also an atmosphere including oxygen and nitrogen, an oxygen atmosphere, and sufficiently dehydrated dry air. In some embodiments in order to prevent water or hydrogen from re-invading the oxide semiconductor layer, exposure to atmosphere after the first heating process is avoided.

Further, before forming the semiconductor layer 105, preheating may be performed to dehydrate or dehydrogenate the semiconductor layer 105.

Further, in some embodiments, moisture and hydrogen residues are removed sufficiently before forming the semiconductor layer 105. Thus, before forming the semiconductor layer, in some embodiments an entrapment vacuum pump is used for evacuation (for example, cryopump, ion pump, and titanium sublimate pump).

Figure 1B:
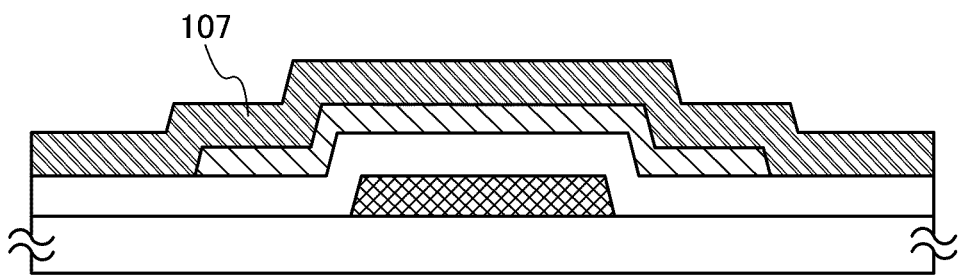

Next, the conductive film 107 is formed to cover the first insulating layer 104 and the semiconductor layer 105 (FIG. 1B).

The conductive film 107 may be formed of conductive material. For example, there are Ti, W, Mo, Ta and their nitride as the conductive material.

Figure 1C:
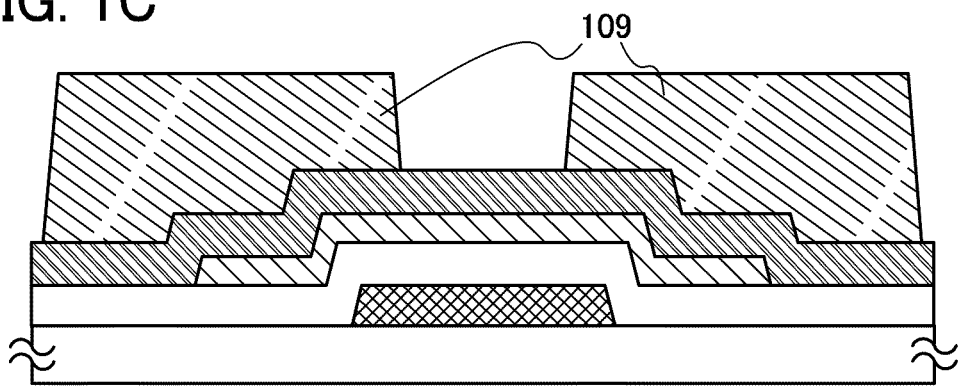

Next, a resist mask 109 is selectively formed over the conductive film 107 (FIG. 1C).

The resist mask 109 may be formed by photolithography.

Figure 1D:
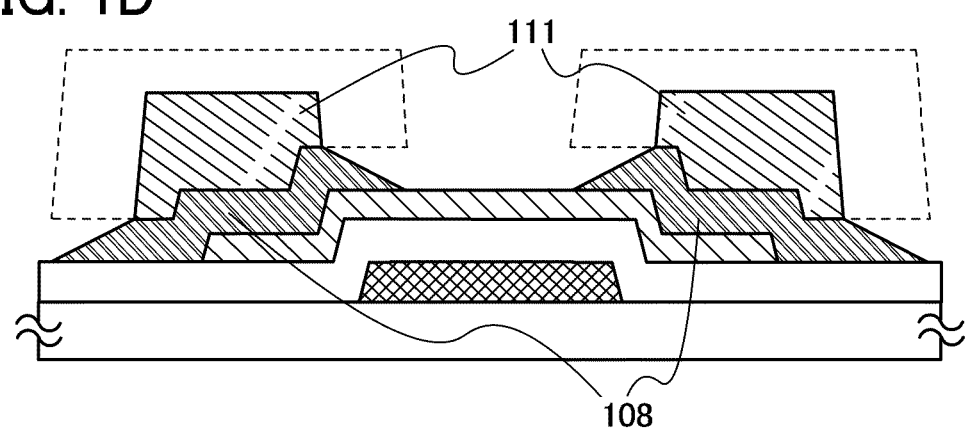

Next, second wiring layers 108 are formed by performing the first etching at the conductive film 107 (FIG. 1D). The second wiring layers 108 constitute at least source and drain electrodes of a transistor. The first etching having a higher etching rate for the conductive film 107 than etching rates for the first insulating layer 104 and the semiconductor layer 105, is performed by reducing the resist mask 109 (or making the resist mask 109 recede).

Because the etching rate of the first etching is higher for the conductive film 107 than for the first insulating layer 104 and the semiconductor layer 105, it is possible to etch the conductive film 107 while preventing the first insulating layer 104 and the semiconductor layer 105 from being etched. Accordingly, it is possible to reduce unevenness of thickness of the semiconductor layer 105 within the substrate surface.

Further, the resist mask 109 is reduced in the first etching as the etching progresses. Thus, the portion of the conductive film 107, which overlaps with the resist mask 109, is exposed as the etching progresses. As such, the time that the surface of the conductive film 107 is exposed to the etching gas changes because the conductive film 107 is gradually exposed as the etching progresses. That is, the portion of the conductive film 107 initially exposed (overlapping with the outer surface of the resist mask 109), is etched more deeply because it is exposed to the etching gas longer. Further, the inner side from the portion overlapping with the outer surface of the resist mask 109 is exposed to the etching gas for a shorter time than the portion overlapping with the outer surface of the resist mask 109, and thus, the inner side is etched more shallowly. Therefore, the conductive film 107 has a tapered shape which has thickness gradually increasing from the portion overlapping with the outer surface of the resist mask 109 to the inner portion thereof.

By using the first etching, the second wiring layers 108 with a tapered shape are formed. Further, the resist mask 109 is reduced by the first etching to become a resist mask 111 (FIG. 1D).

In particular, in some embodiments the first etching is performed using $SF_6$.

Figure 2A:
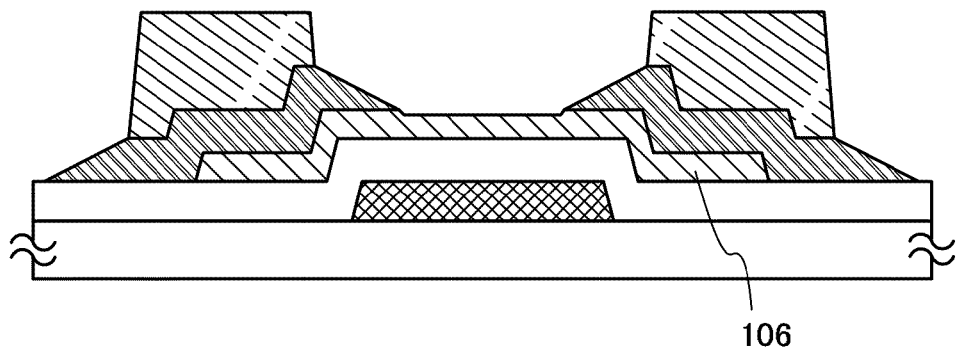
FIGS. 2A to 2D are views showing a manufacturing method of a transistor according to one embodiment of the present invention.

Next, the second etching is performed. By performing the second etching, at least the portion of the semiconductor layer 105, which does not overlap with the second wiring layers 108, are etched so that a semiconductor layer 106 is formed (FIG. 2A).

In some embodiments, the second etching is performed with higher etching rate for at least the semiconductor layer 105 than that of the first etching. Further, the second etching may have a low etching rate for the first insulating layer 104.

Here, the semiconductor layer 105 is etched under the condition that the etching rate for the semiconductor layer 105 of the second etching is higher than that of the first etching. In some embodiments, the etched depth of the semiconductor layer 105 is above 0 nm and equal to or below 5 nm. By performing the second etching as such, the difference of thickness between a first thickness and a second thickness of the semiconductor layer 106 becomes small even when the surface of the substrate is large. Further, a residue on the surface of the semiconductor layer 105 due to the first etching can be removed. Thereby, the characteristics of the transistor can be improved.

Further, the taper angle of the back channel portion of the semiconductor layer 106 is determined depending on the etching rate for the conductive film 107 relative to the etching rate for the semiconductor layer 105. Further, the taper angles of the second wiring layers 108 are determined depending on the etching rate for the resist mask 109 relative to the etching rate for the conductive film 107.

Further, the second etching may be performed by using the resist mask 111, or may be performed by using the second wiring layers 108 as a mask by removing the resist mask 111 after the first etching.

In particular, the second etching may be performed using a mixture gas of $BCl_3$ and $Cl_2$.

By performing the first and second etchings, it is possible to form the wiring layers 108 with a small taper angle, and to reduce the unevenness of thickness of the semiconductor layer 105, and thereby, to improve the characteristics of the transistor. Thus, the unevenness of the transistor characteristics can also be reduced.

Figure 2B:
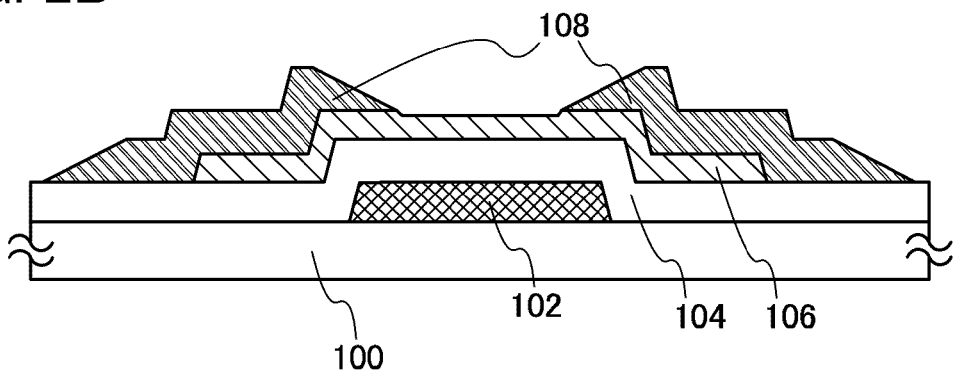

As explained above, the transistor according to this embodiment is achieved (FIG. 2B).

Further, the transistor shown in FIG. 2B is provided over the substrate 100 and includes: the first wiring layer 102, the first insulating layer 104 formed to cover the first wiring layer 102, the semiconductor layer 106 formed over the first insulating layer 104, and the second wiring layers 108 formed to cover the semiconductor layer 106, wherein the thickness of the portion of the semiconductor layer 106, which does not overlap with the second wiring layers 108 (hereinafter, "first thickness"), is smaller than the thickness of the portion of the semiconductor layer 106, which overlaps with the second wiring layers 108 (hereinafter, "the second thickness"), and the difference between the first and second thicknesses is above 0 nm and equal to or below 5 nm.

The transistor shown in FIG. 2B has improved coverage of the layer formed on the upper layer because the wiring layers have small taper angles.

Further, as the taper angles of the wiring layers become smaller, the coverage of the layer formed on the upper layer improves, and thereby, a current leak between the second wiring layers 108 and a third wiring layer 112 is prevented.

In some embodiments, the taper angles of the second wiring layers 108 are equal to or above 15 degrees and equal to or below 45 degrees.

Further, because it is possible to control the thickness of the semiconductor layer 106 in the transistor shown in FIG. 2B, the on-sate current of the transistor is sufficiently large and its off-state current is sufficiently small. Further, even when the surface of the substrate 100 is large, it is possible to achieve a transistor with small unevenness of characteristics and small unevenness of thickness of the semiconductor layer within the substrate surface due to etching.

The thickness of the semiconductor layer 106 may depend on the relationship with the thickness of the first insulating layer 104. When the thickness of the first insulating layer 104 is 100 nm, the thickness of the semiconductor layer 106 may be approximately equal to or above 15 nm. The reliability of the transistor may be improved when the thickness of the semiconductor layer 106 is equal to or above 25 nm. In one embodiment, the thickness of the semiconductor layer 106 is equal to or above 25 nm and equal to or below 50 nm.

Figure 2C:
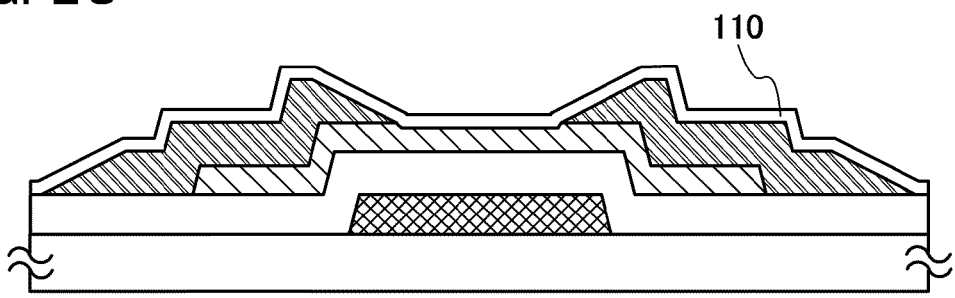

Meanwhile, in other embodiments, the second insulating layer 110 is formed in the transistor shown in FIG. 2B (FIG. 2C).

The second insulating layer 110 may be formed of silicon oxide, silicon nitride, silicon oxynitride or the like, and may be in some embodiments formed by sputtering. It is because re-invasion of moisture and hydrogen can be prevented. In some embodiments, the portion of the second insulating layer 110, which is in contact with the semiconductor layer 106, is formed from silicon oxide. Otherwise, when the second insulating layer 110 has a structure having a plurality of laminated layers, at least a layer, which is in contact with the semiconductor layer 106, may be formed of silicon oxide, and an organic resin layer or the like may be formed over the silicon oxide layer.

Then, a second heating process (which may be performed at a temperature of 200° C. to 400° C., for example, 250° to 350° C.) is performed under an inert gas atmosphere or an oxygen gas atmosphere. For example, the second heating process is performed at a temperature of 250° C. for 1 hour under a nitrogen atmosphere. When the second heating process is performed, a part of the oxide semiconductor layer (channel formation area) is heated while in contact with the second insulating layer 110. Further, the second heating process may be performed after forming the second insulating layer 110. However, its timing is not limited to the above examples.

Figure 2D:
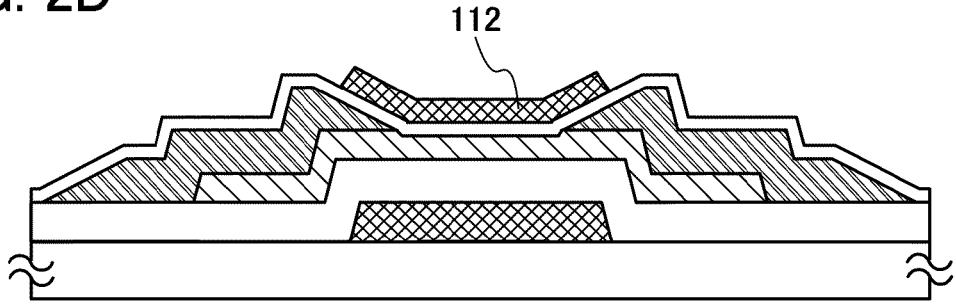

Further, in some embodiments, the third wiring layer 112 is selectively formed over the second insulating layer 110 to overlap with the channel formation area of the semiconductor layer 106 (FIG. 2D). Because the third wiring layer 112 functions as a back gate, it may be formed of conductive material. The third wiring layer 112 may be an electrically independent wiring, electrically connected to the first wiring layer 102, or floating.

When the third wiring layer 112 is an electrically independent wiring, it may function as a back gate which does not depend on the potential of the first wiring layer 102. In this case, it is possible to control the threshold voltage by the back gate.

If the third wiring layer 112 is electrically connected to the first wiring layer 102, the potential can be equal to the potential of the first wiring layer 102 or vary in proportion to the potential of the first wiring layer 102. Further, the current per unit area when the transistor is on can be increased.

If the third wiring layer 112 is floating, the third wiring layer 112 cannot function as a back gate, but it is possible to function as an additional protection layer for the semiconductor layer 106.

Further, a transistor having the semiconductor layer 106, which is a highly purified oxide semiconductor layer, can decrease the off-state current value (off current value) to a level under 10 zA/μm per 1 μm of the channel width, under 100 zA/μm at 85° C. That is, the off current can be lowered to be around the measurement limit or below the measurement limit.

Embodiment 2

The present invention is not limited to the configuration represented in Embodiment 1. For example, as a transistor according to one embodiment of the present invention, it is possible to form a transistor with a BGBC structure.

FIGS. 3A to 3D and FIGS. 4A to 4D are drawings explaining a manufacturing method of a transistor according to this embodiment.

The method of manufacturing a transistor according to this embodiment is described with reference to FIGS. 3A to 3D and FIGS. 4A to 4D, and is characterized in that it includes: forming a first wiring layer 202, forming a first insulating layer 203 to cover the first wiring layer 202, forming a conductive film 207 over the first insulating layer 203, performing at least two steps of etching at the conductive film 207 to form a first insulating layer 204 and second wiring layers 208 which are apart from each other, and forming a semiconductor layer 206 over the first insulating layer 204 and the second wiring layers 208, wherein the two steps of etching include at least a first etching process performed under the condition that the etching rate for the conductive film 207 is higher than the etching rate for the first insulating layer 203, and a second etching process performed under the condition that the etching rates for the conductive film 207 and the first insulating layer 203 are higher than those of the first etching process.

Figure 3A:
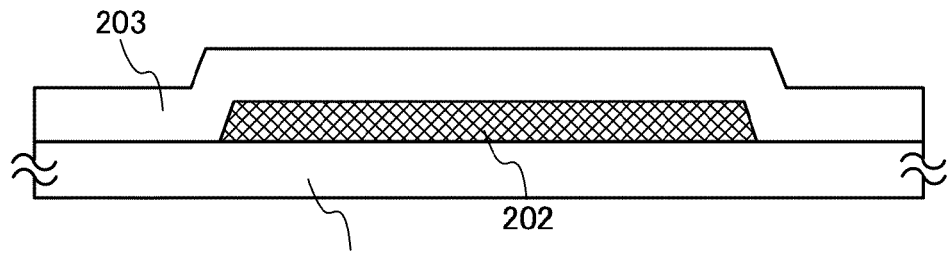
FIGS. 3A to 3D are views showing a manufacturing method of a transistor according to one embodiment of the present invention.

First, the first wiring layer 202 is selectively formed over the substrate 200, and the first insulating layer 203 is formed to cover the first wiring layer 202 (FIG. 3A).

The substrate 200 may be the same as the substrate 100 of Embodiment 1.

The first wiring layer 202 constitutes at least a gate electrode of a transistor. The first wiring layer 202 may be formed of the same material and by the same method as the first wiring layer 102 of Embodiment 1.

The first insulating layer 203 may be formed of the same material and by the same method as the first insulating layer 104 of Embodiment 1.

Figure 3B:
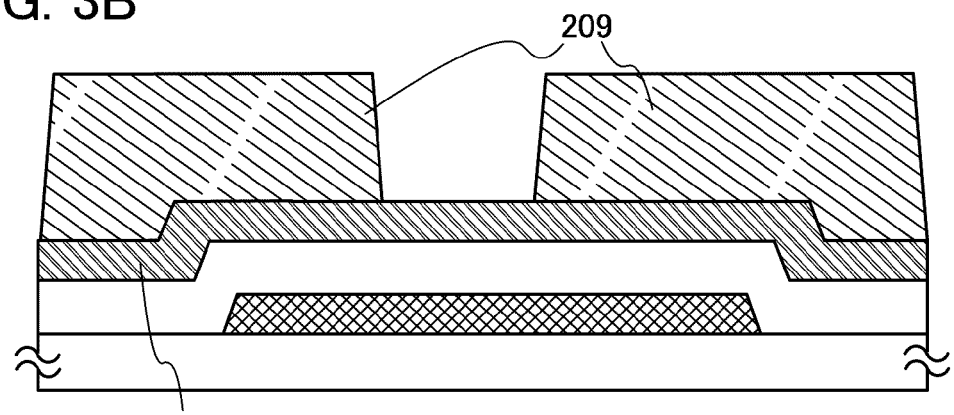

Next, the conductive film 207 is formed over the first insulating layer 203, and the resist mask 209 is selectively formed over the conductive film 207 (FIG. 3B).

The conductive film 207 may be formed of the same material and by the same method as the conductive film 107 of Embodiment 1.

The resist mask 209 may be formed by the same photolithography as the resist mask 109 of Embodiment 1.

Figure 3C:
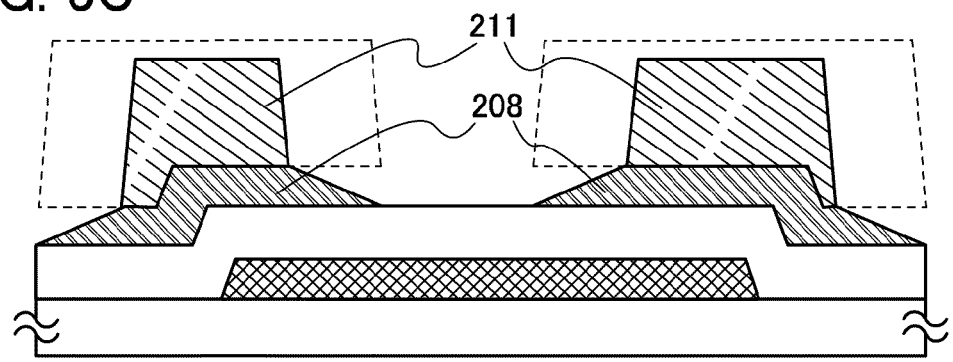

Next, the second wiring layers 208 are formed by performing a first etching at the conductive film 207 (FIG. 3C). The second wiring layers 208 constitute at least source and drain electrodes of a transistor. The first etching may be performed in the same way as Embodiment 1. The second wiring layers 208 with a tapered shape are formed by performing the first etching in the same way as Embodiment 1. Further, the resist mask 209 is reduced by the first etching to become a resist mask 211 (FIG. 3C).

Figure 3D:
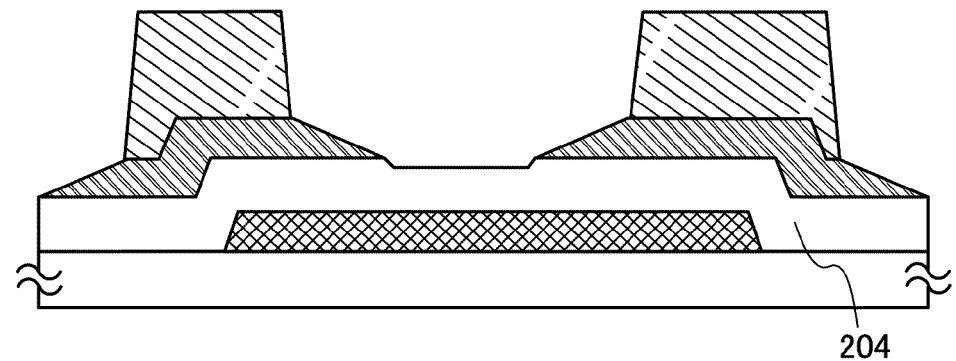

Next, the second etching is performed. The second etching may be performed in the same way as Embodiment 1. By performing the second etching in the same way as Embodiment 1, the portion of the first insulating layer 203, which does not overlap at least with the second wiring layers 208, is etched, thereby the first insulating layer 204 is formed (FIG. 3D). The first insulating layer 204 constitutes at least a gate insulating layer of a transistor.

Figure 4A:
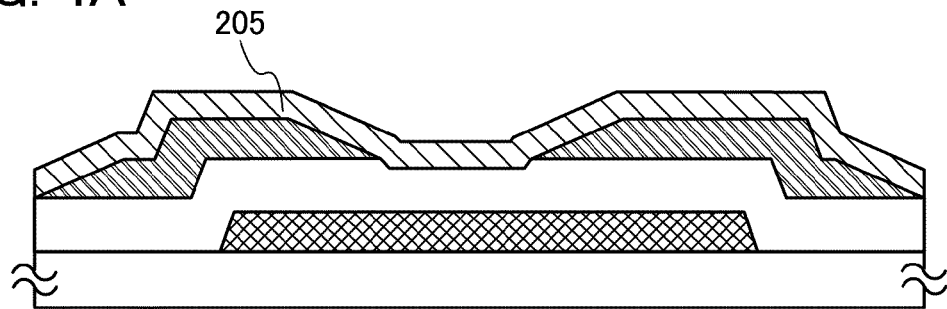
FIGS. 4A to 4D are views showing a manufacturing method of a transistor according to one embodiment of the present invention.

Next, the semiconductor layer 205 is formed over the second wiring layers 208 and the first insulating layer 204 (FIG. 4A).

The semiconductor layer 205 may be formed of the same material and by the same method as the semiconductor layer 105 of Embodiment 1.

Next, the semiconductor layer 206 is formed by processing the semiconductor layer 205. As such, the transistor according to this embodiment is achieved (FIG. 4B).

Figure 4B:
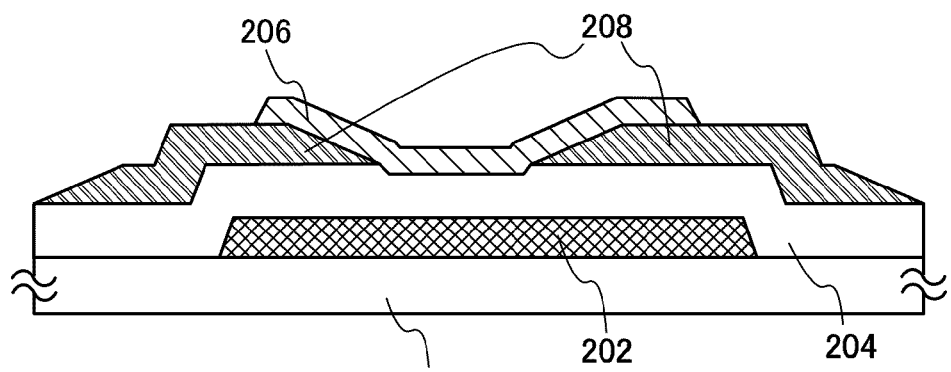
Figure 4C:
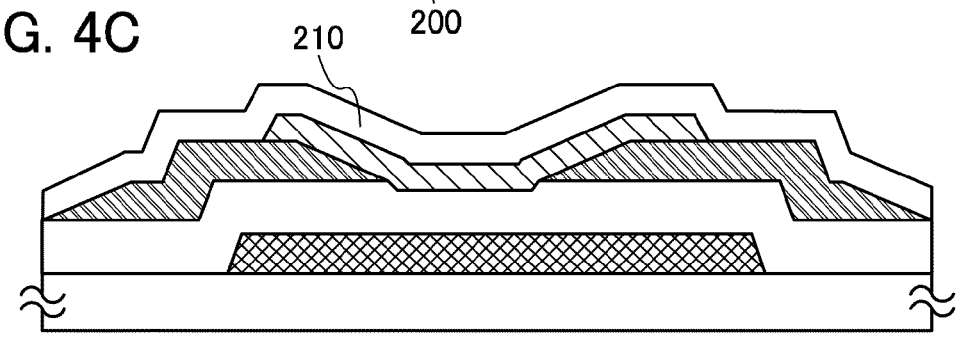

The transistor as shown in FIG. 4B includes: the first wiring layer 202, the first insulating layer 204 formed to cover the first wiring layer 202, the second wiring layers 208 formed over the first insulating layer 204, and the semiconductor layer 206 which overlaps with the first wiring layer 202 and is in contact with the second wiring layer 208, wherein the thickness of the portion of the first insulating layer 204 (hereinafter, "the first thickness"), which does not overlap with the second wiring layers 208, is less than the thickness of the portion of the first insulating layer 204 (hereinafter, "the second thickness"), which overlaps with the second wiring layers 208, and the difference between the first thickness and the second thickness is above 0 nm and equal to or below 5 nm.

The transistor as shown in FIG. 4B has good coverage of the layer formed on the upper layer because the taper angles of the wiring layer are small.

Further, as the taper angles of the wiring layers become small, the coverage of the layer formed on the upper layer is improved, and the leakage current between the second wiring layers 208 and a third wiring layer 212 is suppressed.

Here, the taper angles of the second wiring layers 208 may be equal to or above 15 degrees and equal to or below 45 degrees.

Further, since it is possible to adjust the thickness of the first insulating layer overlapping with the semiconductor layer in the transistor as shown in FIG. 4B, it is possible to adjust the distance from the gate electrode to the semiconductor layer. Moreover, even when the surface of the substrate 200 is large, unevenness in the thickness of the first insulating layer within the substrate surface due to etching is small. The transistor also has small unevenness of characteristics.

Meanwhile, in the transistor as shown in FIG. 4B, in some embodiments a second insulating layer 210 (FIG. 4C) is formed.

The second insulating layer 210 may be formed of the same material and by the same method as the second insulating layer 110 of Embodiment 1.

Figure 4D:
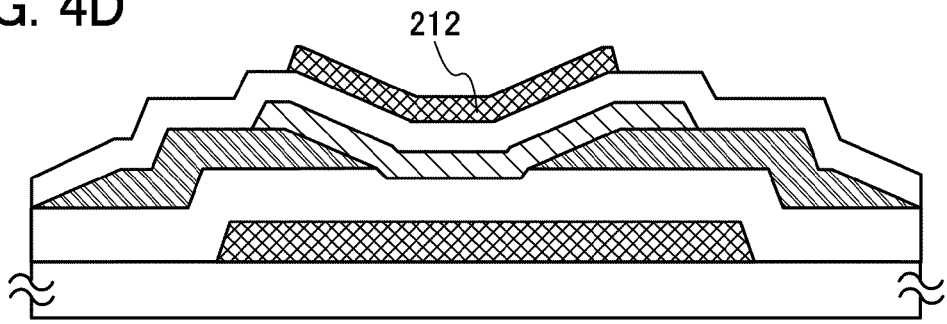

Further, in some embodiments, the third wiring layer 212 is formed selectively over the second insulating layer 210 to overlap with the channel forming area of the semiconductor layer 206 (FIG. 4D). Forming the third wiring layer 212 provides the same effect as forming the third wiring layer 112 in Embodiment 1.

The third wiring layer 212 may be formed of the same material and by the same method as the third wiring layer 112 of Embodiment 1.

As explained in this embodiment, a transistor with a BGBC structure can be manufactured by adjusting the thickness of the insulating layer which is formed in contact with the bottom of the semiconductor layer. Further, although it is not shown, it is possible to use the semiconductor layer 205 as a semiconductor layer having a channel forming area without processing the semiconductor layer 205.

Embodiment 3

The present invention is not limited to the examples represented in Embodiments 1 and 2. For example, as a transistor of one embodiment according to the present invention, it is possible to form a transistor with a TGTC structure.

FIGS. 5A to 5D and FIGS. 6A and 6B are drawings explaining a manufacturing method of a transistor according to this embodiment.

The method of manufacturing a transistor according to this embodiment described with reference to FIGS. 5A to 5D and FIGS. 6A and 6B, includes: forming a semiconductor layer 305, forming a conductive film 307 over the semiconductor layer 305, performing at least two steps of etching at the conductive film 307 to form a semiconductor layer 306 and first wiring layers 308 which are apart from each other, forming an insulating layer 310 to cover the first wiring layers 308 and the semiconductor layer 306, and forming a second wiring layer 312 over the insulating layer 310 to overlap with the semiconductor layer 306, wherein the two steps of etching have at least a first etching process performed under the condition that the etching rate for the conductive film 307 is higher than the etching rate for the semiconductor layer 305, and a second etching process performed under the condition that the etching rates for the conductive film 307 and the semiconductor layer 305 are higher than those of the first etching process.

Figure 5A:
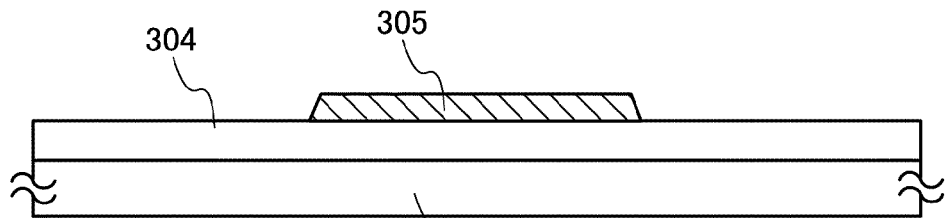
FIGS. 5A to 5D are views showing a manufacturing method of a transistor according to one embodiment of the present invention.

First, in some embodiments, a base insulating layer 304 is formed over the substrate 300, and the semiconductor layer 305 is selectively formed over the base insulating layer 304 (FIG. 5A).

The substrate 300 may be the same as the substrate 100 of Embodiment 1.

The base insulating layer 304 may be formed of the same material and by the same method as the first insulating layer 104 of Embodiment 1.

The semiconductor layer 305 may be formed of the same material and by the same method as the semiconductor layer 105 of Embodiment 1.

Figure 5B:
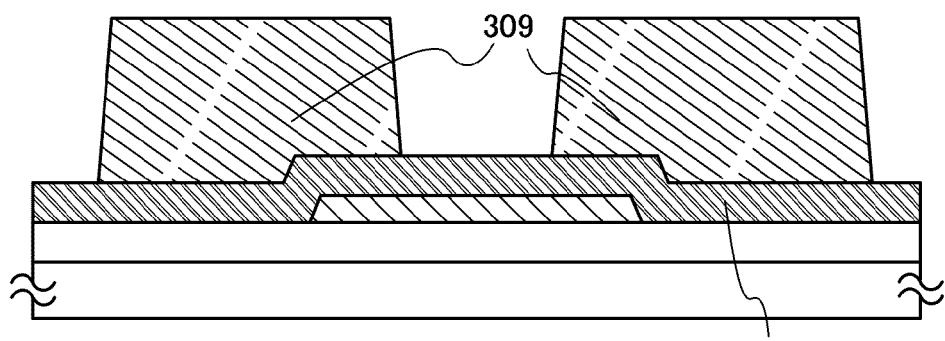

Next, the conductive film 307 is formed over the base insulating layer 304 and the semiconductor layer 305, and a resist mask 309 is selectively formed over the conductive film 307 (FIG. 5B).

The conductive film 307 may be formed of the same material and by the same method as the conductive film 107 of Embodiment 1.

The resist mask 309 may be formed by the same photolithography as the resist mask 109 of Embodiment 1.

Figure 5C:
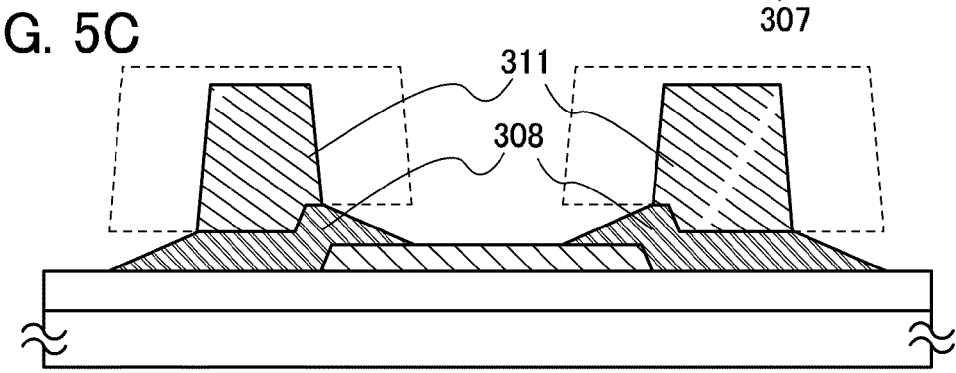

Next, a first etching is performed for the conductive film 307 to form first wiring layers 308 (FIG. 5C). The first wiring layers 308 constitute at least a source electrode and a drain electrode of a transistor. The first etching may be performed in the same way as Embodiment 1. The first wiring layers 308 with a tapered shape are formed by performing the first etching in the same way as Embodiment 1. Further, the resist mask 309 is reduced by the first etching, thereby forming the resist mask 311 (FIG. 5C).

Figure 5D:
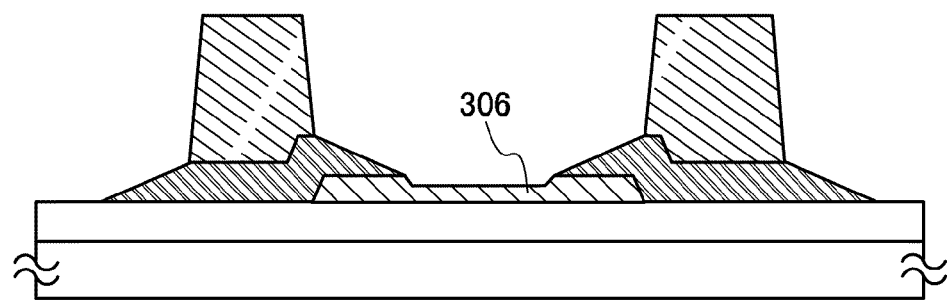

Next, a second etching is performed. The second etching may be performed in the same way as Embodiment 1. By performing the second etching in the same way as Embodiment 1, the portion of the semiconductor layer 305, which does not overlap at least with the first wiring layer 308, is etched to form the semiconductor layer 306 (FIG. 5D).

Figure 6A:
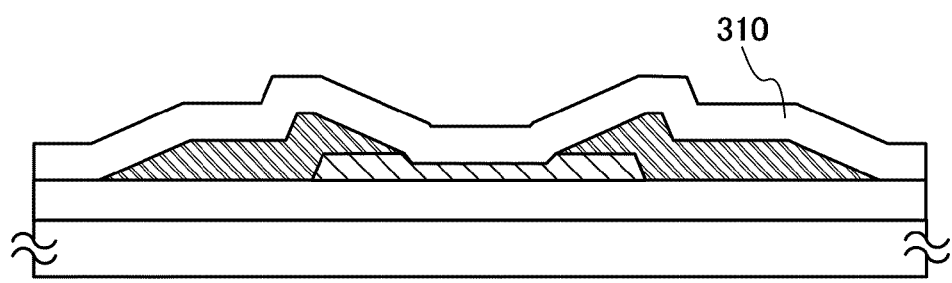
FIGS. 6A and 6B are views showing a manufacturing method of a transistor according to one embodiment of the present invention.

Next, the insulating layer 310 is formed over the first wiring layers 308, the semiconductor layer 306, and the base insulating layer 304 (FIG. 6A). The insulating layer 310 constitutes at least a gate insulating layer of a transistor.

The insulating layer 310 may be formed of the same material and by the same method as the first insulating layer 104 of Embodiment 1.

Figure 6B:
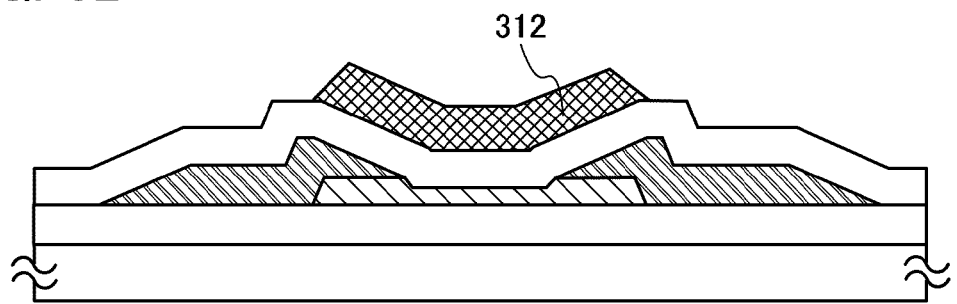

Next, the second wiring layer 312 is selectively formed over the insulating layer 310 to overlap with at least the semiconductor layer 306 (FIG. 6B). The second wiring layer 312 constitutes at least a gate electrode of a transistor. As such, the transistor according to this embodiment is achieved.

The transistor as shown in FIG. 6B includes: the semiconductor layer 306, the first wiring layers 308 formed over the semiconductor layer 306 and apart from each other, the insulating layer 310 formed to cover the first wiring layer 308, and the second wiring layer 312 formed over the insulating layer 310, wherein the thickness of the portion of the semiconductor layer 306 (hereinafter, "first thickness"), which does not overlap with the first wiring layer 308, is less than the thickness of the portion of the semiconductor layer 306 (hereinafter, "second thickness"), which overlaps with the first wiring layer 308. The difference between the first thickness and the second thickness is above 0 nm and equal to or below 5 nm.

The transistor as shown in FIG. 6B has improved coverage of the layer formed on the upper layer, since the taper angles of the wiring layers are small.

Further, as the taper angles of the wiring layers become small, the coverage of the layer formed on the upper layer is improved, and the leakage current between the first wiring layers 308 and the second wiring layer 312 is suppressed.

Here, the taper angles of the first wiring layers 308 are in some embodiments equal to or above 15 degrees and equal to or below 45 degrees.

Further, since it is possible to adjust the thickness of the semiconductor layer 306 in the transistor as shown in FIG. 6B, the on-state current of the transistor is sufficiently large and the off-state current is sufficiently small. Moreover, even when the surface of the substrate 300 is large, the unevenness of the thickness of the semiconductor layer due to etching is small within the substrate surface. The transistor also has small unevenness of characteristics.

The thickness of the semiconductor layer 306 is determined depending on the relationship with the thickness of the insulating layer 310. When the thickness of the insulating layer 310 is 100 nm, the semiconductor layer 306 is approximately equal to or above 15 nm. If the thickness of the semiconductor layer 306 is equal to or above 25 nm, the reliability of the transistor is improved. In one embodiment, the range of the thickness of the semiconductor layer 306 is equal to or above 25 nm and equal to or below 50 nm.

As explained in this embodiment, the transistor having a TGTC structure may be manufactured by adjusting the thickness of the semiconductor layer.

Further, although not illustrated, the back gate may be disposed between the base insulating layer 304 and the substrate 300 to overlap with the semiconductor layer 306. Disposing the back gate in this manner provides the same effect as forming the third wiring layer 112 in Embodiment 1.

Embodiment 4

The present invention is not limited to the aspects described in Embodiments 1 to 3. For example, a transistor having a TGBC structure may be made as a transistor of one aspect of the present invention.

FIGS. 7A to 7D and FIGS. 8A to 8C are views showing the manufacturing method of the transistor of this embodiment.

The manufacturing method of the transistor according to this embodiment described with reference to FIGS. 7A to 7D and FIGS. 8A to 8C includes: forming a base insulating layer 403, forming a conductive film 407 over the base insulating layer 403, performing at least two steps of etching at the conductive film 407 to form a base insulating layer 404 and first wiring layers 408 to be apart from each other, forming a semiconductor layer 406 over the base insulating layer 404 and the first wiring layers 408, forming an insulating layer 410 to cover the base insulating layer 404, the semiconductor layer 406, and the first wiring layers 408, and forming a second wiring layer 412 over the insulating layer 410 to overlap with the semiconductor layer 406, wherein the two steps of etching comprise at least a first etching step, which is performed under the condition that the etching rate is higher for the conductive film 407 than for the base insulating layer 403, and a second etching step, which is performed under the condition that the etching rates for the conductive film 407 and the base insulating layer 403 are higher than those of the first etching step.

Figure 7A:
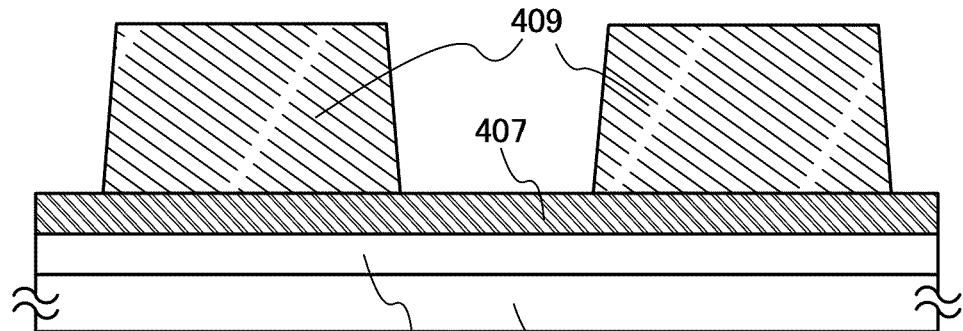
FIGS. 7A to 7D are views showing a manufacturing method of a transistor according to one embodiment of the present invention.

First, the base insulating layer 403 is formed over a substrate 400. The conductive film 407 is formed over the base insulating layer 403. A resist mask 409 is selectively formed over the conductive film 407 (FIG. 7A).

The substrate 400 may be the same as the substrate 100 in Embodiment 1.

The base insulating layer 403 may be formed of the same material and by the same manufacturing method as those of the first insulating layer 104 in Embodiment 1.

The conductive film 407 may be formed of the same material and by the same manufacturing method as those of the conductive film 107 in Embodiment 1.

The resist mask 409 may be formed by the photolithography method as the resist mask 109 in Embodiment 1.

Figure 7B:
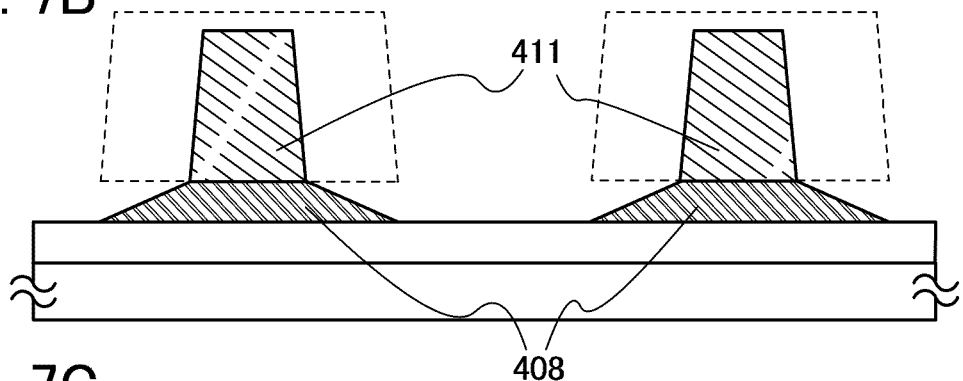

Next, the first wiring layers 408 are formed by performing a first etching step at the conductive film 407 (FIG. 7B). The first wiring layers 408 constitute at least a source electrode and a drain electrode of a transistor. The first etching step may be performed as described in Embodiment 1. By performing the first etching step as described in Embodiment 1, the first wiring layers 408 are formed to have a tapered shape. Further, the resist mask 409 is reduced by the first etching step to become a resist mask 411 (FIG. 7B).

Figure 7C:
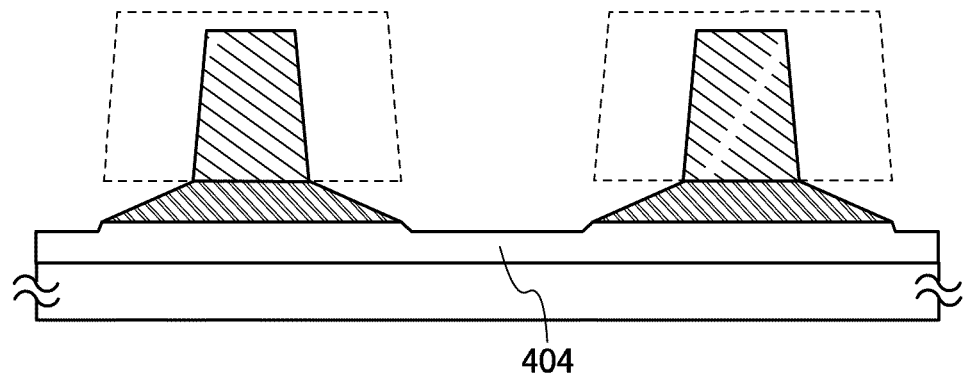

Next, a second etching step is performed. The second etching step is performed as described in Embodiment 1. By performing the second etching step as described in Embodiment 1, at least a portion of the base insulating layer 403, which does not overlap with the first wiring layer 408, is etched to form the base insulating layer 404 (FIG. 7C).

Figure 7D:
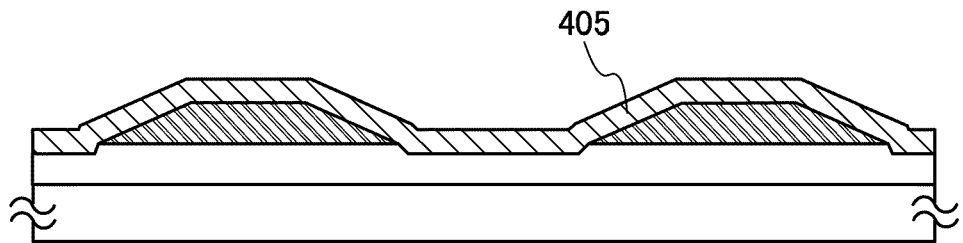

Then, a semiconductor layer 405 is formed over the first wiring layers 408 and the base insulating layer 404 (FIG. 7D).

The semiconductor layer 405 may be formed of the same material and by the same manufacturing method as those of the semiconductor layer 105 in Embodiment 1.

Figure 8A:
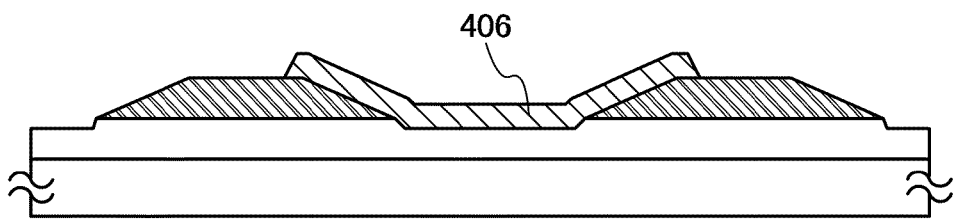
FIGS. 8A to 8C are views showing a manufacturing method of a transistor according to one embodiment of the present invention.

Next, the semiconductor layer 406 is formed by processing the semiconductor layer 405 (FIG. 8A).

Figure 8B:
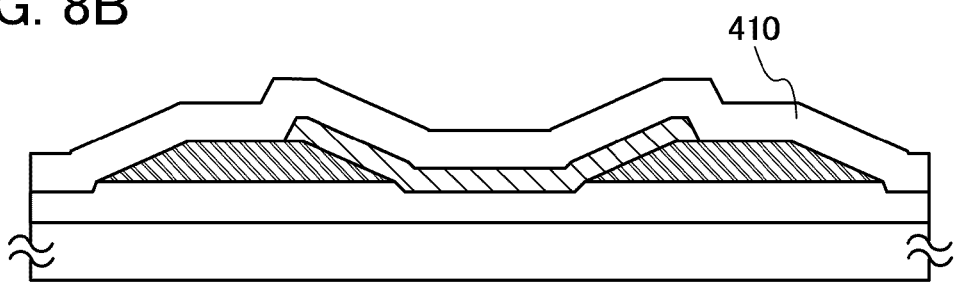

Then, the insulating layer 410 is formed to cover the base insulating layer 404, the first wiring layers 408, and the semiconductor layer 406 (FIG. 8B). The insulating layer 410 constitutes at least a gate insulating layer of the transistor.

The insulating layer 410 may be formed of the same material and by the same manufacturing method as those of the first insulating layer 104 in Embodiment 1.

Figure 8C:
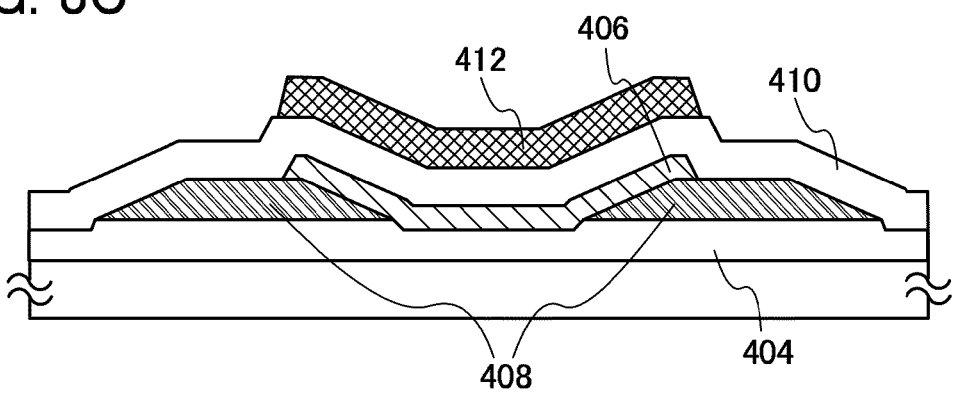

Next, the second wiring layer 412 is selectively formed over the insulating layer 410 to overlap at least with the semiconductor layer 406 (FIG. 8C). The second wiring layer 412 constitutes at least a gate electrode of the transistor.

The second wiring layer 412 may be formed of the same material and by the same manufacturing method as those of the third wiring layer 112 in Embodiment 1. Accordingly, the transistor according to this embodiment is manufactured (FIG. 8C).

The transistor shown in FIG. 8C includes: the base insulating layer 404, the first wiring layers 408 formed over the base insulating layer 404 to be apart from each other, the semiconductor layer 406 formed over the base insulating layer 404 and the first wiring layers 408, the insulating layer 410 formed to cover the semiconductor layer 406 and the first wiring layers 408, and the second wiring layer 412 formed over the insulating layer 410 to overlap with the semiconductor layer 406, wherein the thickness of the portion of the base insulating layer 404 which does not overlap with the first wiring layer 408 (hereinafter, "first thickness") is smaller than the thickness of the portion of the base insulating layer 404 which overlaps with the first wiring layer 408 (hereinafter, "second thickness"), and the difference between the first thickness and the second thickness is above 0 nm, and equal to or below 5 nm.

In the transistor shown in FIG. 8C, the wiring layer has a small taper angle, and thus, the layer formed at the top layer has improved coverage.

Further, as the taper angle of the wiring layer becomes small, the coverage of the layer formed at the top layer is improved, and the leakage current between the first wiring layer 408 and the second wiring layer 412 is suppressed.

Here, in some embodiments, the taper angle of the first wiring layer 408 is in the range of 15 to 45 degrees.

As explained in this embodiment, a transistor having a TGBC structure may be manufactured by adjusting the thickness of the base.

Further, although not illustrated, a back gate may be disposed between the base insulating layer 404 and the substrate 400 to overlap with the semiconductor layer 406. Disposing the back gate in this manner may provide the same effect as forming the third wiring layer 112 in Embodiment 1.

Embodiment 5

Next, electronic equipment will be described as one aspect of the present invention. At least one of the components explained in Embodiments 1 to 4 is mounted in the electronic equipment as one aspect of the present invention. The electronic equipment as one aspect of the present invention may be, for example, a computer, a mobile phone (this may be also called a cellular phone or a portable phone device), a personal digital assistant (PDA; including a portable game device and a sound player, etc.), a digital camera, a digital video camera, an electronic paper, and a television device (this can be also called a television or a television receiver).

Figure 9A:
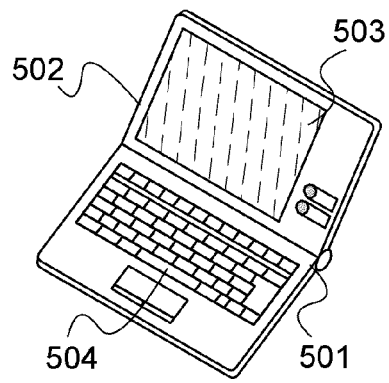
FIGS. 9A to 9F are views showing electronic equipments according to one embodiment of the present invention.

FIG. 9A shows a laptop-type personal computer which includes a housing 501, a housing 502, a display 503, and a keyboard 504, etc. At least one of the components explained in Embodiments 1 to 4 is mounted in the housings 501 and 502. By mounting at least one of the components explained in Embodiments 1 to 4 into the laptop-type personal computer illustrated in FIG. 9A, the power consumption and the area occupied by the components can be reduced.

Figure 9D:
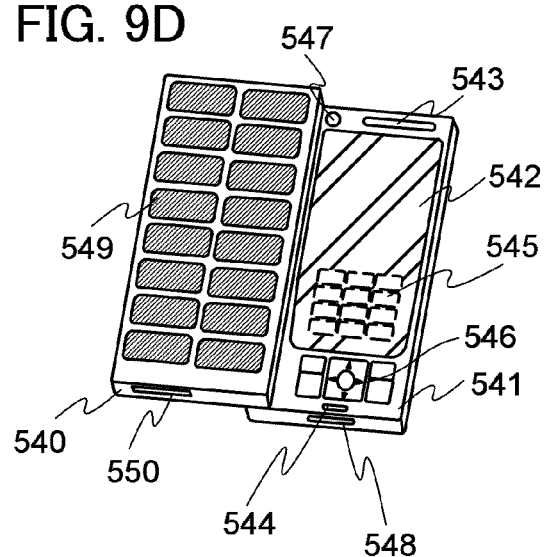
Figure 9B:
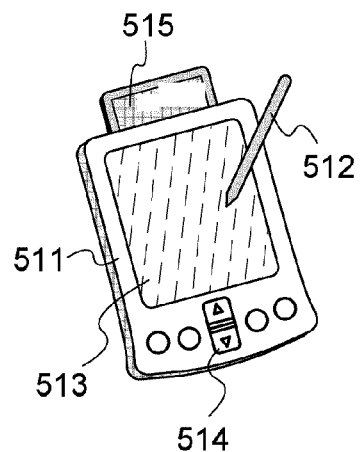

FIG. 9B shows a personal digital assistant (PDA), in the main body 511 of which a display 513, an external interface 515, and an operation button 514 are disposed. Further, a stylus 512 for operating the PDA is provided. In the main body 511, at least one of the components explained in Embodiments 1 to 4 is mounted. By mounting at least one of the elements explained in Embodiments 1 to 4 in the PDA illustrated in FIG. 9B, the power consumption and the area occupied by the components can be reduced.

Figure 9E:
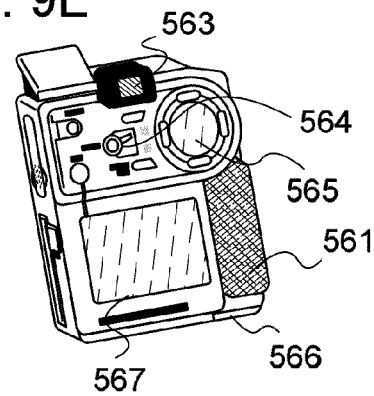
Figure 9C:
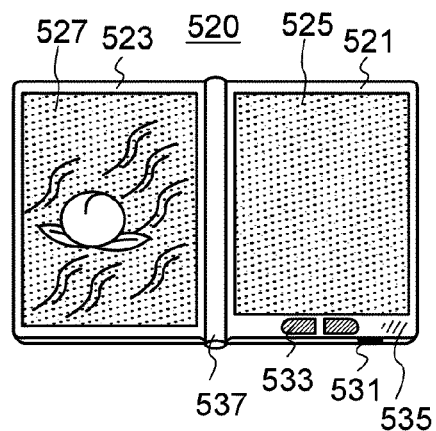

FIG. 9C shows an electronic book (e-book) 520 with an electronic paper included therein, which is made up of two housings, i.e., housings 521 and 523. In the housings 521 and 523, a display 525 and a display 527 are installed, respectively. The housings 521 and 523 are connected to each other via an axis 537. The open and close operations can be achieved around the axis 537. Further, the housing 521 includes a power supply 531, an operation key 533, and a speaker 535, etc. In at least one of the housings 521 and 523, at least one of the components explained in Embodiments 1 to 4 is mounted. By mounting at least one of the components explained in Embodiments 1 to 4 into the electronic book illustrated in FIG. 9C, the power consumption and the area occupied by the components can be reduced.

FIG. 9D shows a mobile phone, which includes two housings, i.e., housings 540 and 541. Further, the housings 540 and 541 can slide to transform from the unfolding state as illustrated in FIG. 9D to the overlapping state so as to enable a compact size proper for carrying the phone. Moreover, the housing 541 includes a display panel 542, a speaker 543, a microphone 544, a pointing device 546, a camera lens 547, and an external connection terminal 548, etc. The housing 540 includes a solar battery cell 549 to recharge the mobile phone, and an external memory slot 550, etc. Further, an antenna is embedded in the housing 541. In at least one of the housings 540 and 541, at least one of the components explained in Embodiments 1 to 4 is mounted. By mounting at least one of the components explained in Embodiments 1 to 4 in the mobile phone illustrated in FIG. 9D, the power consumption and the area occupied by the components can be reduced.

FIG. 9E shows a digital camera, which includes a main body 561, a display 567, an eyepiece 563, an operation button 564, a display 565, and a battery 566, etc. In the main body 561, at least one of the components explained in Embodiments 1 to 4 is mounted. By mounting at least one of the components explained in Embodiments 1 to 4 in the digital camera illustrated in FIG. 9E, the power consumption and the area occupied by the elements can be reduced.

Figure 9F:
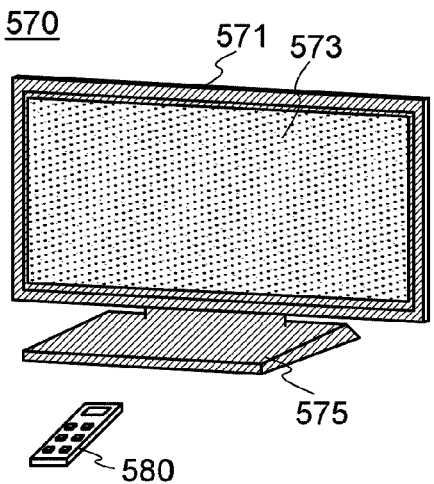

FIG. 9F shows a television device 570, which includes a housing 571, a display 573 and a stand 575, etc. Operation of the television device 570 can be performed by a switch provided in the housing 571 or a remote controller 580. In the housing 571 or the remote controller 580, at least one of the components explained in Embodiments 1 to 4 is mounted. By mounting at least one of the components explained in Embodiments 1 to 4 in the television device illustrated in FIG. 9F, the power consumption and the area of occupied by the components can be reduced.

Example 1

The present example uses the transistor in Embodiment 1, i.e., the transistor illustrated in FIG. 2C. Further, a base insulating layer is formed between the substrate 100 and the first wiring layer 102.

The first wiring layer 102 is formed of W (tungsten). Its thickness is 150 nm.

The first insulating layer 104 is formed of a silicon oxynitride. Its thickness is 100 nm.

The semiconductor layer 106 is formed of an In—Ga—Zn—O-based oxide semiconductor. Its thickness is 50 nm.

The second wiring layers 108 are formed of Ti. Its thickness is 150 nm.

The second insulating layer 110 is formed of a silicon oxide. Its thickness is 300 nm.

Here, three samples are prepared for comparison.

As for a first sample, the etching for processing the conductive film 107 to form the second wiring layers 108 is performed using only a mixture gas of $BCl_3$ and $Cl_2$.

As for the second sample, the etching for processing the conductive film 107 to form the second wiring layers 108 is performed over two steps. The first etching step is performed using a mixture gas of $BCl_3$ and $Cl_2$, and the second etching step is performed using only a gas of $SF_6$.

As for the third sample, the etching for processing the conductive film 107 to form the second wiring layers 108 is performed using only a gas of $SF_6$.

Figure 10:
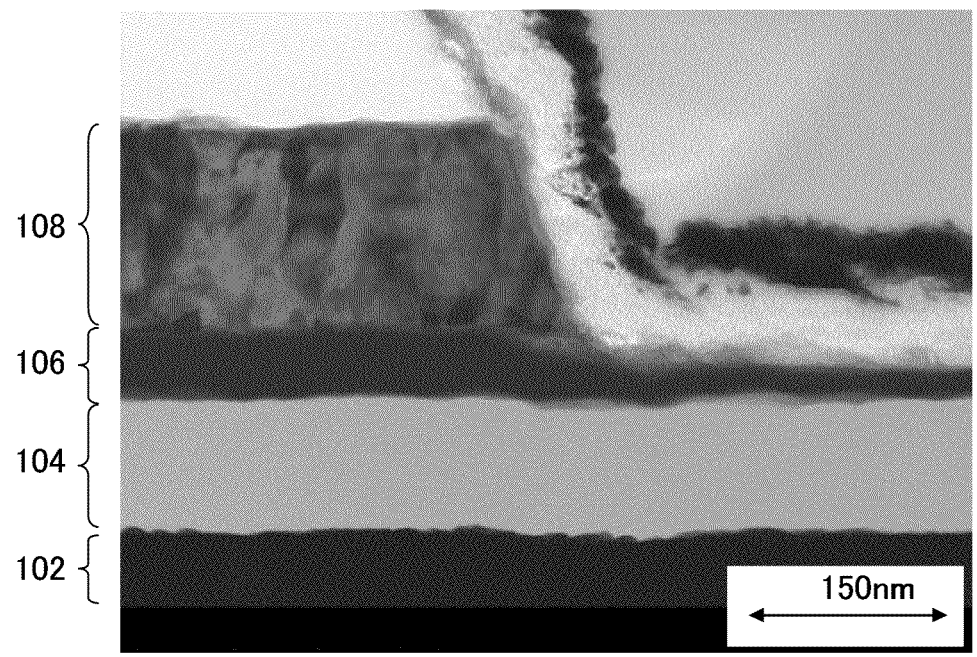
FIG. 10 is a STEM image according to one embodiment of the present invention.

In the first sample, the taper angle of the second wiring layer 108 is about 65 degrees. The difference between the first thickness and the second thickness of the semiconductor layer 106 is about 25 nm (FIG. 10).

Figure 11:
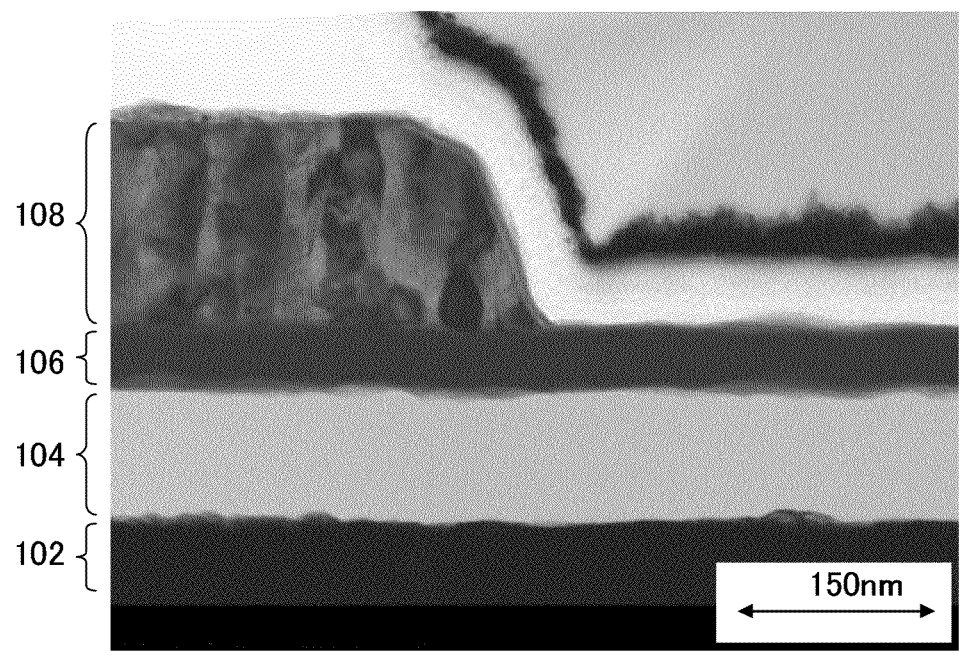
FIG. 11 is a STEM image according to one embodiment of the present invention.

In the second sample, the taper angle of the second wiring layer 108 is about 65 degrees. However, the edge between the top and side of the second wiring layer 108 is worn out to become rounded shape. The radius of curvature of the rounded shape is about 100 nm. The difference between the first and second thicknesses of the semiconductor layer 106 is about zero (FIG. 11). Since the difference between the first and second thicknesses of the semiconductor layer 106 is about zero, the shape of the second sample is in some embodiments preferable to that of the first sample.

Figure 12:
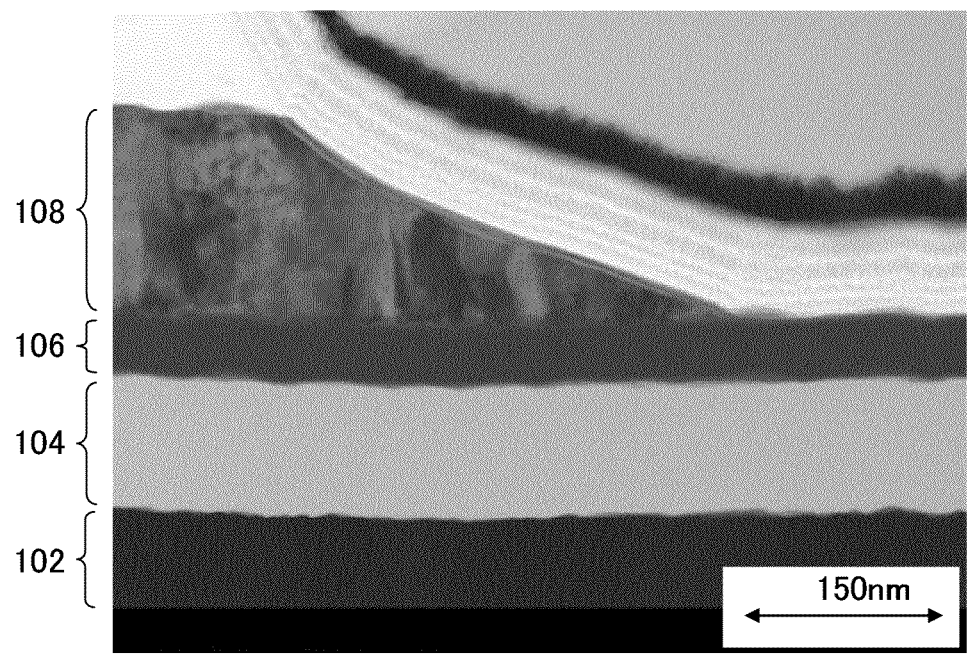
FIG. 12 is a STEM image according to one embodiment of the present invention.

In the third sample, the taper angle of the second wiring layer 108 is about 20 degrees. The difference between the first thickness and the second thickness of the semiconductor layer 106 is about zero (FIG. 12).

Comparing the second and third samples, the second wiring layer 108 of the third sample has a very small taper angle. By making the taper angle of the second wiring layer 108 small, the coverage of the second insulating layer 110 is improved.

However, the switching characteristics of the third sample are not good. In particular, the off-state current is large. Accordingly, by slightly etching using a mixture gas of $BCl_3$ and $Cl_2$ after etching using only a gas of $SF_6$, a transistor having improved switching characteristics, i.e., having a high on-off ratio, can be achieved.

Further, by using a gas of $SF_6$, a high selection rate of the conductive film 107 with respect to the semiconductor layer 105 can be achieved. Moreover, even if the bias-power is low to the extent that the plasma damage on the semiconductor layer 105 can be prevented, the second wiring layers 108 can be formed to have a tapered shape by making the resist recede.

This application is based on Japanese Patent Application serial no. 2010-035434 filed with Japan Patent Office on Feb. 19, 2010, the entire contents of which are hereby incorporated by reference.

What is claimed is:

1. A method of manufacturing a transistor, the method comprising:
    forming a first wiring layer;
    forming an insulating film to cover the first wiring layer;
    forming a semiconductor layer over the insulating film;
    forming a conductive film over the semiconductor layer; and
    patterning the conductive film to form second wiring layers which are apart from each other by at least a first etching process and a second etching process after the first etching process,
    wherein the first etching process is performed in a first condition that a first etching rate for the conductive film is higher than a second etching rate for the semiconductor layer, and
    wherein the second etching process is performed in a second condition that a third etching rate for the conductive film is higher than the first etching rate, and a fourth etching rate for the semiconductor layer is higher than the second etching rate.

2. The method of manufacturing a transistor according to claim 1, wherein the first etching process is performed using $SF_6$ and the second etching process is performed using a mixed gas of $BCl_3$ and $Cl_2$.

3. The method of manufacturing a transistor according to claim 1, wherein the semiconductor layer includes an oxide semiconductor.

4. The method of manufacturing a transistor according to claim 1, wherein the first etching process and the second etching process are performed by dry etching.

5. The method of manufacturing a transistor according to claim 1,
    wherein a first film thickness of a first portion of the semiconductor layer, which is not overlapped with the second wiring layers, is thinner than a second film thickness of a second portion of the semiconductor layer, which is overlapped with one of the second wiring layers, and
    wherein a difference between the first film thickness and the second film thickness is above 0 nm and equal to or below 5 nm.

6. The method of manufacturing a transistor according to claim 1, wherein a taper angle of the second wiring layer is equal to or above 15 degrees and equal to or below 45 degrees.

7. A method of manufacturing a transistor, the method comprising:
    forming a first wiring layer;
    forming a first insulating film to cover the first wiring layer;
    forming a semiconductor layer over the first insulating film;
    forming a conductive film over the semiconductor layer; and
    patterning the conductive film to form second wiring layers which are apart from each other by at least a first etching process and a second etching process after the first etching process; and
    forming a second insulating film to cover the second wiring layers and the semiconductor layer,
    wherein the first etching process is performed in a first condition that a first etching rate for the conductive film is higher than a second etching rate for the semiconductor layer, and
    wherein the second etching process is performed in a second condition that a third etching rate for the conductive film is higher than the first etching rate, and a fourth etching rate for the semiconductor layer is higher than the second etching rate.

8. The method of manufacturing a transistor according to claim 7, wherein the first etching process is performed using $SF_6$ and the second etching process is performed using a mixed gas of $BCl_3$ and $Cl_2$.

9. The method of manufacturing a transistor according to claim 7, wherein the semiconductor layer includes an oxide semiconductor.

10. The method of manufacturing a transistor according to claim 7, wherein the first etching process and the second etching process are performed by dry etching.

11. The method of manufacturing a transistor according to claim 7,
    wherein a first film thickness of a first portion of the semiconductor layer, which is not overlapped with the second wiring layers, is thinner than a second film thickness of a second portion of the semiconductor layer, which is overlapped with one of the second wiring layers, and
    wherein a difference between the first film thickness and the second film thickness is above 0 nm and equal to or below 5 nm.

12. The method of manufacturing a transistor according to claim 7, wherein a taper angle of the second wiring layer is equal to or above 15 degrees and equal to or below 45 degrees.

13. A method of manufacturing a transistor, the method comprising:
    forming a first wiring layer;
    forming a first insulating film to cover the first wiring layer;

forming a semiconductor layer over the first insulating film;

forming a conductive film over the semiconductor layer; and patterning the conductive film to form second wiring layers which are apart from each other by at least a first etching process and a second etching process after the first etching process;

forming a second insulating film to cover the second wiring layers and the semiconductor layer; and forming a third wiring layer over the second insulating film, wherein the first etching process is performed in a first condition that a first etching rate for the conductive film is higher than a second etching rate for the semiconductor layer, and wherein the second etching process is performed in a second condition that a third etching rate for the conductive film is higher than the first etching rate, and a fourth etching rate for the semiconductor layer is higher than the second etching rate.

14. The method of manufacturing a transistor according to claim 13, wherein the first etching process is performed using $SF_6$ and the second etching process is performed using a mixed gas of $BCl_3$ and $Cl_2$.

15. The method of manufacturing a transistor according to claim 13, wherein the semiconductor layer includes an oxide semiconductor.

16. The method of manufacturing a transistor according to claim 13, wherein the first etching process and the second etching process are performed by dry etching.

17. The method of manufacturing a transistor according to claim 13, wherein a first film thickness of a first portion of the semiconductor layer, which is not overlapped with the second wiring layers, is thinner than a second film thickness of a second portion of the semiconductor layer, which is overlapped with one of the second wiring layers, and wherein a difference between the first film thickness and the second film thickness is above 0 nm and equal to or below 5 nm.

18. The method of manufacturing a transistor according to claim 13, wherein a taper angle of the second wiring layer is equal to or above 15 degrees and equal to or below 45 degrees.

19. A method of manufacturing a transistor, the method comprising:

forming a semiconductor layer;

forming a conductive film over the semiconductor layer; and patterning the conductive film to form wiring layers which are apart from each other by at least a first etching process and a second etching process after the first etching process, wherein the first etching process is performed in a first condition that a first etching rate for the conductive film is higher than a second etching rate for the wherein the second etching process is performed in a second condition that a third etching rate for the conductive film is higher than the first etching rate, and a fourth etching rate for the semiconductor layer is higher than the second etching rate.

20. The method of manufacturing a transistor according to claim 19, wherein the first etching process is performed using $SF_6$ and the second etching process is performed using a mixed gas of $BCl_3$ and $Cl_2$.

21. The method of manufacturing a transistor according to claim 19, wherein the semiconductor layer includes an oxide semiconductor.

22. The method of manufacturing a transistor according to claim 19, wherein the first etching process and the second etching process are performed by dry etching.

23. The method of manufacturing a transistor according to claim 19, wherein a first film thickness of a first portion of the semiconductor layer, which is not overlapped with the wiring layers, is thinner than a second film thickness of a second portion of the semiconductor layer, which is overlapped with one of the wiring layers, and wherein a difference between the first film thickness and the second film thickness is above 0 nm and equal to or below 5 nm.

24. The method of manufacturing a transistor according to claim 19, wherein a taper angle of the wiring layer is equal to or above 15 degrees and equal to or below 45 degrees.

* * * * *